(12) United States Patent
Yoshioka et al.

(10) Patent No.: US 12,399,857 B2
(45) Date of Patent: Aug. 26, 2025

(54) APPARATUS FOR INPUTTING SIGNAL FROM COMMUNICATION LINE AND METHOD THEREOF

(71) Applicant: Asahi Kasei Microdevices Corporation, Tokyo (JP)

(72) Inventors: Tomohiro Yoshioka, Tokyo (JP); Yoshitaka Okutsu, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 82 days.

(21) Appl. No.: 18/391,720

(22) Filed: Dec. 21, 2023

(65) Prior Publication Data

US 2024/0213970 A1   Jun. 27, 2024

(30) Foreign Application Priority Data

Dec. 27, 2022  (JP) ................................. 2022-209279

(51) Int. Cl.
*G06F 13/40*   (2006.01)
(52) U.S. Cl.
CPC ............................... *G06F 13/4072* (2013.01)

(58) Field of Classification Search
CPC .................................................. G06F 13/4072
See application file for complete search history.

(56) References Cited

U.S. PATENT DOCUMENTS

| 5,404,172 A | 4/1995 | Berman |
| 5,856,750 A | 1/1999 | Koseki |
| 8,698,543 B1 | 4/2014 | Dribinsky |
| 11,057,070 B1 * | 7/2021 | Lin ....................... H04L 7/0008 |
| 2004/0108880 A1 | 6/2004 | Takase |
| 2006/0119401 A1 | 6/2006 | Kitagawa |

FOREIGN PATENT DOCUMENTS

JP   H02137549 A   5/1990

* cited by examiner

*Primary Examiner* — Patrick O Neill

(57) ABSTRACT

Provided is an apparatus including: a first input circuit which inputs signal from a first communication line; a second input circuit which inputs a signal from a second communication line; a reference voltage generation circuit which generates a reference voltage; and a comparison circuit which compares the reference voltage with a voltage of the first communication line. The first input circuit and the second input circuit adjust judgement thresholds to be used for judging a signal value according to the comparison result obtained by the comparison circuit.

20 Claims, 6 Drawing Sheets

| PARAMETER | SYMBOL | Min | Typ | Max | UNIT |
|---|---|---|---|---|---|
| OPERATION VOLTAGE | V$_{DD}$ | 1.10 | 1.20 | 1.30 | V |
| | | 1.70 | 1.80 | 1.90 | |
| | | 3.00 | 3.30 | 3.60 | |
| LOW LEVEL INPUT VOLTAGE | V$_{IL}$ | −0.1*V$_{DD}$ | − | 0.3*V$_{DD}$ | V |
| HIGH LEVEL INPUT VOLTAGE | V$_{IH}$ | 0.7*V$_{DD}$ | − | 1.1*V$_{DD}$ | V |
| SCHMITT TRIGGER INPUT HYSTERESIS | V$_{hys}$ | 0.1*V$_{DD}$ | − | − | V |

FIG.1

APPARATUS FOR INPUTTING SIGNAL FROM COMMUNICATION LINE AND METHOD THEREOF

The contents of the following patent application(s) are incorporated herein by reference: NO. 2022-209279 filed in JP on Dec. 27, 2022

BACKGROUND

1. Technical Field

The present invention relates to an apparatus which inputs a signal from a communication line, and a method thereof.

2. Related Art

Conventionally, there is known a serial bus interface such as I²C. Patent Document 1 describes that: a I²C serial communication bus uses a full-duplex serial line composed of two lines which are a serial data line (SDA) and a serial clock line (SCL); the SDA line and the SCL line are each connected to Vdd through a pull-up resistor; the Vdd is usually from 1.2 V to 3.3 V; and so on (refer to BACKGROUND OF THE INVENTION).

Also, Patent Document 1 describes that: a voltage Vcap that approximates a voltage of the Vdd is generated by charging a capacitor C1 with a voltage corresponding to an SDA signal and a SCL signal; the voltage Vcap provides a reference voltage for a Schmitt trigger 208a and a Schmitt trigger 208b; and so on (refer to columns 4 to 5).

PRIOR ART DOCUMENT

Patent Document

Patent Document 1: Specification of U.S. Pat. No. 8,698,543

BRIEF DESCRIPTION OF THE DRAWINGS

FIG. 1 illustrates examples of voltage specifications for a communication line.

DESCRIPTION OF EXEMPLARY EMBODIMENTS

Figure 2:
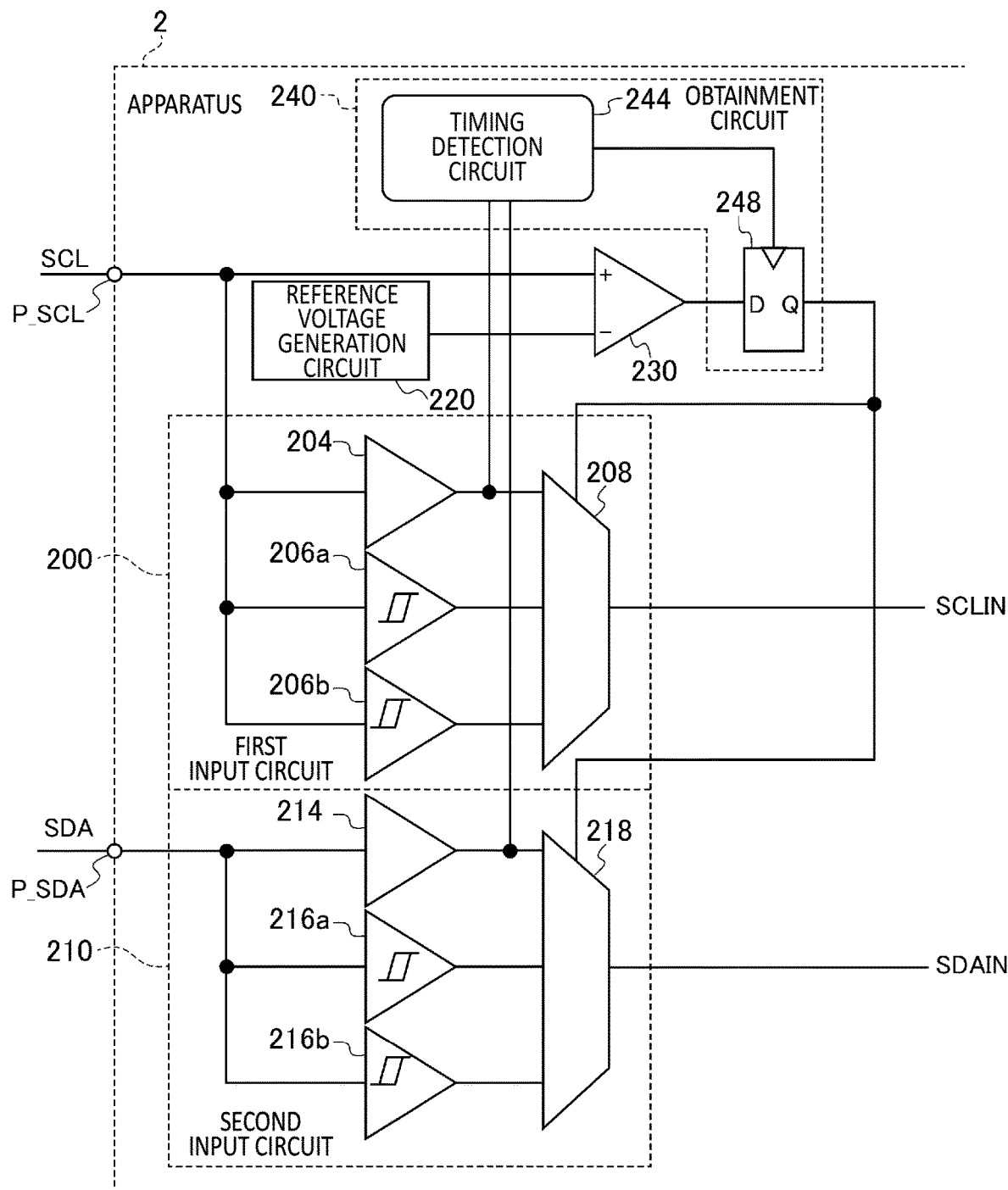
FIG. 2 illustrates structure of an apparatus 2 according to the present embodiment.

Hereinafter, the present invention will be described through embodiments of the invention, but the following embodiments do not limit the invention according to claims. In addition, not all of the combinations of features described in the embodiments are essential to the solution of the invention.

FIG. 1 illustrates examples of voltage specifications for a communication line. The examples in the present drawing show voltage specifications of a signal that is transmitted by means of SDA and SCL communication lines of an I²C interface. In these voltage specifications, an operation voltage $V_{DD}$ is defined by three types of standards which are: a 1.2 V standard (with a typical value of 1.2 V in the drawing); a 1.8 V standard (with a typical value of 1.8 V in the drawing); and a 3.3 V standard (with a typical value of 3.3 V in the drawing). Both of an allowable minimum voltage and an allowable maximum voltage of $V_{DD}$ are defined for the 1.2 V standard, 1.8 V standard, and 3.3 V standard. For example, for the 1.2 V standard, the $V_{DD}$ should be within a range from 1.10 V to 1.30 V.

A LOW level input voltage $V_{IL}$ needs to be within a range from $-0.1 \times V_{DD}$ to $0.3 \times V_{DD}$. A HIGH level input voltage $V_{IH}$ needs to be within a range from $0.7 \times V_{DD}$ to $1.1 \times V_{DD}$. An input hysteresis $V_{hys}$ of a Schmitt trigger to be used for signal input should be $0.1 \times V_{DD}$ or more.

While an I²C interface having a constant voltage has been standardized where 1.8 V standard, 2.0 V standard, etc. are used, with a progress in low-voltage standardization in recent years, a 1.2 V standard has also been used for an I²C interface. Therefore, for systems which perform device-to-device communication by means of the I²C interface, there are a system using $V_{DD}$ of the 1.8 V standard, and a system using $V_{DD}$ of the 1.2 V standard. Because of this, it is desirable for apparatuses to be used for such systems, such as IC devices or LSI devices, to support both of a 1.8 V standard I²C interface and a 1.2 V standard I²C interface.

When supporting both of the 1.8 V standard I²C interface and the 1.2 V standard I²C interface, a minimum value of a HIGH level input voltage $V_{IH}$ (minimum voltage when the SDA and the SCL are at logic H) is calculated as $0.7 \times 1.1$ V (minimum value of the $V_{DD}$)=0.77 V. A maximum value of a LOW level input voltage $V_{IL}$ (maximum voltage when the SDA and the SCL are at logic L) is calculated as $0.3 \times 1.9$ V (maximum value of the $V_{DD}$)=0.57 V. Here, if supporting the both of the 1.8 V standard and the 1.2 V standard with an input buffer having one input hysteresis, an input hysteresis $V_{hys}$ of the input buffer is calculated as $0.1 \times 1.9$ V (maximum value of the $V_{DD}$)=0.19 V.

Therefore, if supporting the both of the 1.8 V standard and the 1.2 V standard with the input buffer having one threshold value and the one input hysteresis, the input hysteresis $V_{hys}$ needs to be 0.19 V in spite of a fact that there is a margin of only 0.2 V (=0.77 V–0.57 V) between the minimum value 0.77 V of the HIGH level input voltage $V_{IH}$ and the maximum value 0.57 V of the LOW level input voltage $V_{IL}$. Hence, it is difficult to support the 1.8 V standard and the 1.2 V standard by means of such an input buffer.

FIG. 2 illustrates structure of an apparatus 2 according to the present embodiment. For example, the apparatus 2 is an IC device, an LSI device, or a multi-chip module (MCM). The apparatus 2 includes a communication interface for communicating with another IC device, or the like. The apparatus 2 according to the present embodiment supports, as an example of such a communication interface, an I²C interface that is a serial communication interface, a successor interface of the I²C interface, or the like. The apparatus 2 includes an external terminal P_SCL (also referred to as a "first external terminal") connected to a SCL communication line (also referred to as a "first communication line") which serves as a clock communication line of the I²C interface, and an external terminal P_SDA (also referred to as a "second external terminal") connected to a SDA communication line (also referred to as a "second communication line") which serves as a data communication line of the I²C interface.

For convenience of explanation, the present drawing shows a structural part related to a receiver which receives signals from the first external terminal and the second external terminal in the apparatus 2. The apparatus 2 may further include a transmitter which transmits signals to another apparatus through the first external terminal and the second external terminal.

The apparatus 2 may be a four-terminal device including a power supply terminal and a ground terminal, in addition to the first external terminal and the second external terminal. Such an apparatus 2 may be a sensor device such as a magnetic sensor, and supplies another apparatus with a measurement value through the communication interface. Instead of this, the apparatus 2 may include more terminals, and may also include another communication interface for communicating with another apparatus, apart from the communication interface using the first external terminal and the second external terminal.

The apparatus 2 according to the present embodiment adjusts a judgement threshold of an input circuit, based on a result obtained by comparing a voltage of a communication line with a reference voltage. This enables the apparatus 2 to be adaptable to voltage specifications of multiple types. By way of example, the apparatus 2 according to the present embodiment supports two types of voltage specifications being 1.8 V standard and 1.2 V standard in an I$^2$C interface. The apparatus 2 includes a first input circuit 200, a second input circuit 210, a reference voltage generation circuit 220, a comparison circuit 230, and an obtainment circuit 240.

The first input circuit 200 is connected to the first external terminal, and inputs a signal from the first communication line. Note that, in the present specification, a word "connected" used hereinafter means "electrically connected" unless specifically noted, and its meaning is not only limited to a direct electrical connection between components but also an indirect electrical connection including another component connected between components. The first input circuit 200 outputs a logical value corresponding to a voltage value of the signal from the first communication line as a signal value SCLIN from the first communication line, to another internal circuit (unillustrated) in the apparatus 2. The first input circuit 200 has an input detector 204, input detectors 206a to 206b, and a selector 208.

The input detector 204 is connected to the first external terminal. For example, the input detector 204 may be an input buffer circuit, and detects whether a signal value of the first communication line is at a HIGH level. Here, the input detector 204 detects whether a voltage of the first communication line exceeds a threshold voltage (also referred to as a "first voltage"). This first voltage is set to such a value by which the signal value of the first communication line can be detected as being at the HIGH level in any voltage specification among the voltage specifications of the multiple types. In the present embodiment, the input detector 204 has the first voltage as the threshold voltage which exceeds a maximum value of a LOW level voltage (0.3×1.9=0.57 V) in the 1.8 V standard and is less than a minimum value of a HIGH level voltage (0.7×1.10=0.77 V) in the 1.2 V standard. The input detector 204 may not have an input hysteresis, or may have an input hysteresis less than an input hysteresis defined in the communication interface.

The multiple input detectors 206a to 206b (also referred to as "input detectors 206") are connected to the first external terminal. The multiple input detectors 206 may each be an input buffer circuit, for example. The multiple input detectors 206 detect signal values corresponding to the voltage of the first communication line by using judgement thresholds different from each other. Here, the multiple input detectors 206 may each be provided corresponding to each voltage specification of the voltage specifications of the multiple types, and has a judgement threshold for a corresponding voltage specification.

In the present embodiment, the input detector 206a is used for the 1.8 V standard, and has the judgement threshold that exceeds the maximum value of the LOW level voltage (e.g., 0.3×1.9=0.57 V) and is less than the minimum value of the HIGH level voltage (e.g., 0.7×1.7=1.19 V). The input detector 206b is used for the 1.2 V standard, and has the judgement threshold that exceeds the maximum value of the LOW level voltage (e.g., 0.3×1.30=0.39 V) and is less than the minimum value of the HIGH level voltage (e.g., 0.7×1.10=0.77 V). The input detectors 206a to 206b have input hystereses satisfying the voltage specifications of the communication interface.

The selector 208 is connected to the obtainment circuit 240 and the multiple input detectors 206. The selector 208 selects a signal value output by one input detector 206 between the multiple input detectors 206 as output of the first input circuit 200, depending on a comparison result obtained by the comparison circuit 230. In the present embodiment, the selector 208 selects the input detector 206a in response to receiving a comparison result indicating logic H from the obtainment circuit 240, or selects the input detector 206b in response to receiving a comparison result indicating logic L.

The second input circuit 210 is connected to the second external terminal, and inputs a signal from the second communication line. The second input circuit 210 outputs a logical value corresponding to a voltage value of the signal from the second communication line as a signal value SDAIN from the second communication line, to another circuit (unillustrated) in the apparatus 2. The second input circuit 210 has an input detector 214, input detectors 216a to 216b, and a selector 218.

The input detector 214 is connected to the second external terminal. For example, the input detector 214 may be an input buffer circuit, and detects whether the signal value of the second communication line is at a HIGH level. Here, the input detector 214 detects whether a voltage of the second communication line exceeds a threshold voltage (also referred to as a "second voltage"). This second voltage is set to such a value by which the signal value of the second communication line can be detected as being at a LOW level in any voltage specification among the voltage specifications of the multiple types. In the present embodiment, the input detector 214 has the second voltage as the threshold voltage which exceeds the maximum value of the LOW level voltage (0.3×1.9=0.57 V) in the 1.8 V standard and is less than the minimum value of the HIGH level voltage (0.7×1.10=0.77 V) in the 1.2 V standard. Note that, the second voltage may be equal to the first voltage, or may be different from the first voltage. The input detector 214 may not have an input hysteresis, or may have an input hysteresis less than an input hysteresis defined in the communication interface.

The multiple input detectors 216a to 216b (also referred to as "input detectors 216") are connected to the second external terminal. The multiple input detectors 216 detect signal values corresponding to voltage of the second communication line by using judgement thresholds different from each other. Since the multiple input detectors 216 have functions and structure the same as those of the multiple input detectors 206, explanations for them will be omitted except for the following differences.

The selector 218 is connected to the obtainment circuit 240 and the multiple input detectors 216. The selector 218 selects a signal value output by one input detector 216 between the multiple input detectors 216 as output of the second input circuit 210, depending on a comparison result obtained by the comparison circuit 230. In the present embodiment, the selector 218 selects the input detector 216a in response to receiving a comparison result indicating logic H from the obtainment circuit 240, or selects the input detector 216b in response to receiving a comparison result indicating logic L.

The reference voltage generation circuit 220 generates the reference voltage. The reference voltage generation circuit 220 generates as the reference voltage, a threshold voltage for judging which voltage specification among the voltage specifications of the multiple types is operating the communication interface, based on the voltage of the first communication line. Here, the first communication line and the second communication line are pulled-up to a voltage (e.g. 1.8 V or 1.2 V) corresponding to the voltage specification of the communication interface, which results in having voltages approximately the same as the voltage corresponding to the voltage specification under a stable state at a HIGH level. Therefore, the reference voltage generation circuit 220 according to the present embodiment has the threshold voltage higher than 1.30 V that is the maximum voltage for the 1.2 V standard, and lower than 1.70 V (e.g. 1.4 V) that is the minimum voltage for the 1.8 V standard.

The comparison circuit 230 is connected to the first external terminal and the reference voltage generation circuit 220. The comparison circuit 230 compares the reference voltage with the voltage of the first communication line. In the present embodiment, the comparison circuit 230 outputs a comparison result indicating logic H (HIGH) when the voltage of the first communication line exceeds the reference voltage, and outputs a comparison result indicating logic L (LOW) when the voltage of the first communication line is the reference voltage or less.

The obtainment circuit 240 is connected to the first input circuit 200, the second input circuit 210, and the comparison circuit 230. The obtainment circuit 240 obtains the comparison result output by the comparison circuit 230 according to a predetermined timing. The obtainment circuit 240 has a timing detection circuit 244 and a storage circuit 248.

The timing detection circuit 244 is connected to the input detector 204 in the first input circuit 200, and the input detector 214 in the second input circuit 210. The timing detection circuit 244 determines a timing to obtain the comparison result output by the comparison circuit 230 by using the signal value of the first communication line detected by the input detector 204 and the signal value of the second communication line detected by the input detector 214. The timing detection circuit 244 may determine as the comparison result obtainment timing, a timing at which a signal value of the first communication line is definitely at a HIGH level due to specification of the communication interface when considering relationship between the signal value of the first communication line and the signal value of the second communication line. The timing detection circuit 244 may determine such an obtainment timing by means of logic operations for the signal value of the first communication line detected by the input detector 204 and the signal value of the second communication line detected by the input detector 214. A method for determining the obtainment timing performed by the obtainment circuit 240 will be described later.

The storage circuit 248 is connected to the comparison circuit 230 and the timing detection circuit 244. The storage circuit 248 may be a flip-flop, a register, a memory, etc. and obtains and stores the comparison result output by the comparison circuit 230 at the obtainment timing determined by the timing detection circuit 244. In the example shown in the present drawing, the storage circuit 248 is a flip-flop, and performs sampling on the comparison result input into a D terminal in response to a rise in a timing signal from the timing detection circuit 244, then outputs the comparison result from a Q terminal.

This enables the first input circuit 200 and the second input circuit 210 to adjust the judgement thresholds to be used for judging signal values by switching input detectors in the first input circuit 200 and the second input circuit 210 depending on the comparison result obtained by the comparison circuit 230 and received through the obtainment circuit 240. More specifically, when the voltage of the first communication line exceeds the reference voltage, the first input circuit 200 and the second input circuit 210 respectively select the input detector 206a and the input detector 216a which are for the voltage specification using a higher voltage (the 1.8 V standard in the example of the present drawing) among the voltage specifications of the multiple types. When the voltage of the first communication line is the reference voltage or less, the first input circuit 200 and the second input circuit 210 respectively select the input detector 206b and the input detector 216b which are for the voltage specification using a lower voltage (1.2 V standard in the example of the present drawing) among the voltage specifications of the multiple types. Therefore, even when voltage specifications of multiple types cannot be supported by an input circuit having one threshold value, the apparatus 2 judges which voltage specification among the voltage specifications of multiple types is used for a communication interface and adjusts a judgement threshold of an input circuit, so that the apparatus 2 can support the voltage specification.

In addition, the storage circuit 248 may store a comparison result availability flag indicating whether the comparison result is available, and output the comparison result availability flag to the first input circuit 200 and the second input circuit 210. For example, after a power supply of the apparatus 2 being inserted, after the apparatus 2 being reset, or the like, the storage circuit 248 has a value indicating "unavailable" for the comparison result availability flag because comparison has never been performed by the comparison circuit 230. The storage circuit 248 has a value indicating "available" for the comparison result availability flag in response to being instructed by the timing detection circuit 244 to obtain the comparison result obtained by the comparison circuit 230 (e.g., in response to receiving the obtainment timing from the timing detection circuit 244).

When the comparison result availability flag indicates "unavailable", the selector 208 in the first input circuit 200 and the selector 218 in the second input circuit 210 respectively select output of the input detector 204 and output of the input detector 214. When the comparison result availability flag indicates "available", the selector 208 in the first input circuit 200 and the selector 218 in the second input circuit 210 respectively select output of the input detector 206a and output of the input detector 216a, or output of the input detector 206b and output of the input detector 216b, depending on the comparison result obtained by the comparison circuit 230. This enables the apparatus 2 to use the signal values of the first external terminal and the second external terminal by means of the input detector 204 and the input detector 214, in a state where it has not been judged which voltage specification among the voltage specifications of the multiple types will be used.

The apparatus 2 may not only automatically selects a voltage specification of the communication interface by selecting output of the selector 208 and output of the selector 218 depending on the comparison result obtained by the comparison circuit 230, but also make the automatic selection function for the voltage specification unavailable and set an unchanging voltage specification. For example, the apparatus 2 may set whether to make the automatic selection function available based on a specified voltage value for the communication interface, and a value of an automatic setting availability flag indicating whether the automatic selection function is available, and set which voltage specification to select when the automatic selection function is made unavailable.

For example, when the automatic setting availability flag indicates "available", as mentioned above, the selector 208 selects a signal value output by one input detector between the multiple input detectors 206 (or instead, the input detector 204) as output of the first input circuit 200, depending on the comparison result obtained by the comparison circuit 230 (the comparison result stored in the storage circuit 248). Similarly, the selector 218 selects a signal value output by one input detector between the multiple input detectors 216 (or instead, the input detector 214) as output of the second input circuit 210.

When the automatic setting availability flag indicates "unavailable", the selector 208 selects a signal value output by one input detector between the multiple input detectors 206 (or instead, the input detector 204) as output of the first input circuit 200, according to the specified voltage value. Similarly, the selector 218 selects a signal value output by one input detector between the multiple input detectors 216 (or instead, the input detector 214) as output of the second input circuit 210. Here, the specified voltage value may be a selection value which specifies either of the multiple input detectors 206 (or instead, the input detector 204).

The apparatus 2 may store the specified voltage value and the automatic setting availability flag in the storage circuit 248, another internal register, or the like. The apparatus 2 may receive the specified voltage value and the automatic setting availability flag from another apparatus through the communication interface or another interface, and store the same inside the apparatus 2. Note that, the apparatus 2 may set the automatic setting availability flag as "available" after the power supply of the apparatus 2 is inserted, after the apparatus 2 is reset, or the like.

In this case, the another apparatus may read out the comparison result in the storage circuit 248 through the communication interface in response to the automatic setting for the voltage specification being completed in the apparatus 2, and then the another apparatus may set the specified voltage value corresponding to the comparison result to the apparatus 2 as well as setting the automatic setting availability flag of the apparatus 2 as "unavailable", through the communication interface. This enables the first input circuit 200 and the second input circuit 210 to continuously output unchanging output of the input detectors that is temporarily selected by means of the automatic selection function, from when the another apparatus performs the setting onward.

Note that, if a voltage specification of the communication interface has already been known, the another apparatus may set a specified voltage value to the apparatus 2 as well as setting the automatic setting availability flag as "unavailable" through the communication interface, without reading out the comparison result stored in the storage circuit 248 of the apparatus 2. This enables the apparatus 2 to correctly receive the specified voltage value through the communication interface of which the voltage specification has been set automatically.

Figure 3:
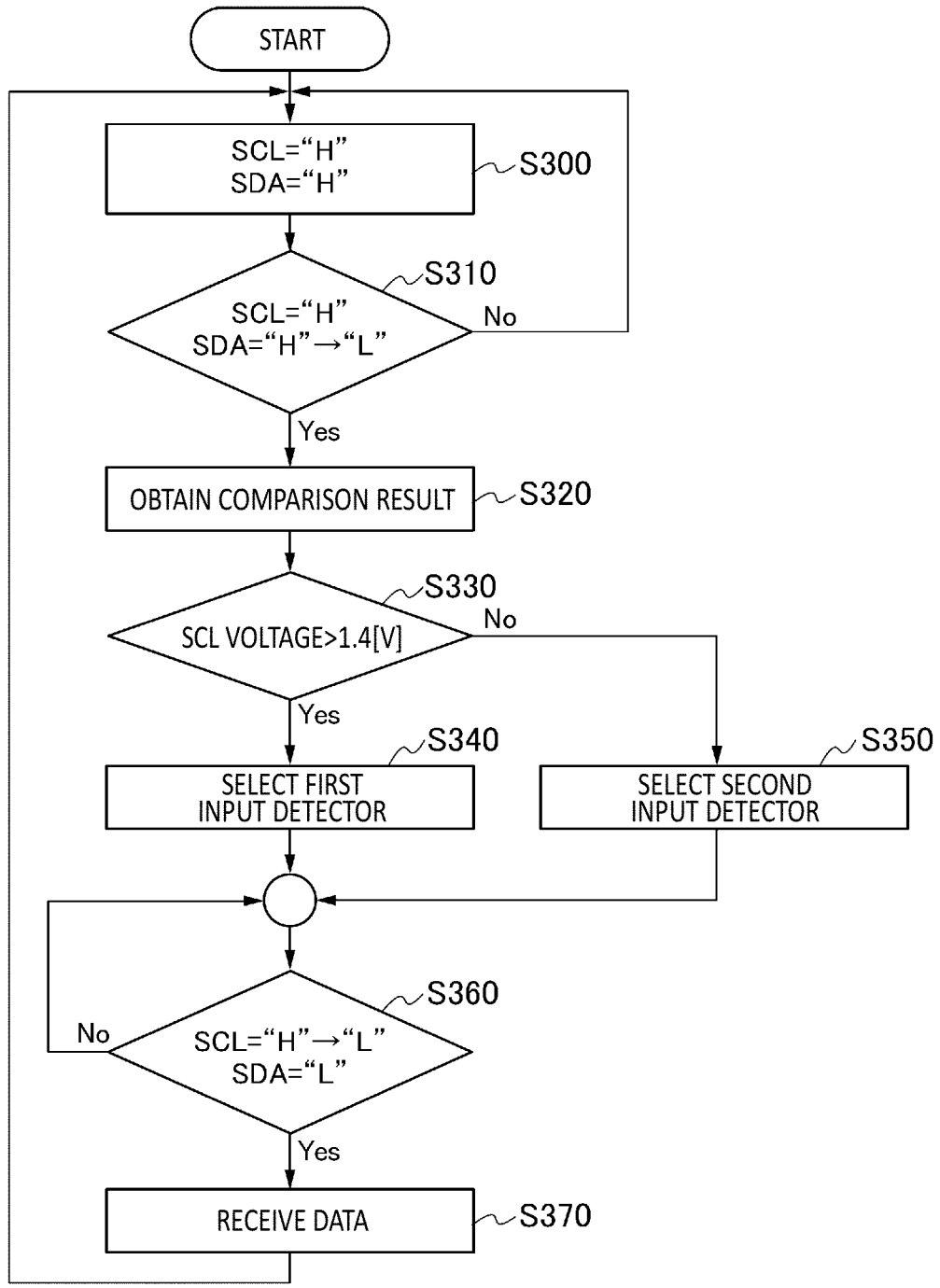
FIG. 3 illustrates an operational flow of the apparatus 2 according to the present embodiment.

FIG. 3 illustrates an operational flow of the apparatus 2 according to the present embodiment. In S300, the first communication line and the second communication line have logic H signal values, and their voltages are at HIGH levels. For example, for the I²C interface, each communication line is pulled-up to a power source voltage $V_{DD}$ corresponding to a voltage specification (i.e. 1.8 V for the 1.8 V standard, 1.2 V for the 1.2 V standard) through a pull-up resistor. In a state in which none of apparatuses connected to the first communication line and the second communication line has started communication, all apparatuses release each of their communication lines, thus a voltage of the each of their communication lines rises to a power source voltage $V_{DD}$.

Because of this, a voltage of a signal from the first communication line exceeds the first voltage, the input detector 204 outputs logic H. Also, because a voltage of a signal from the second communication line exceeds the second voltage, the input detector 214 outputs logic H.

In S310, the timing detection circuit 244 in the obtainment circuit 240 determines a timing to obtain the comparison result output by the comparison circuit 230 by using the signal value of the first communication line detected by the input detector 204 and the signal value of the second communication line detected by the input detector 214. In the present embodiment, the timing detection circuit 244 waits until the signal from the second communication line changes by using the output of the input detector 214 (No in S310), and determines the comparison result obtainment timing in response to a timing of change in the signal from the second communication line (Yes in S310).

In S320, the storage circuit 248 in the obtainment circuit 240 obtains the comparison result obtained by the comparison circuit 230 comparing the reference voltage with the voltage of the first communication line at the obtainment timing determined by the timing detection circuit 244. Here, in the I²C interface, communication starts in response to a start condition being met by the logic H signal from the second communication line changing into a logic L signal during a period in which the signal from the first communication line is at logic H. Therefore, the timing of change for the logic H signal from the second communication line to change into the logic L signal during the period in which the signal from the first communication line is at logic H is definitely a timing in which the signal value of the first communication line is at a HIGH level due to the specification of the I²C interface. Accordingly, the obtainment circuit 240 according to the present embodiment obtains the comparison result according to the timing of change in the signal from the second communication line during the period in which the voltage of the signal from the first communication line exceeds the first voltage.

In S330, S340, and S350, the first input circuit 200 and the second input circuit 210 adjust judgement thresholds according to the comparison result obtained by the obtainment circuit 240. When there is obtained the comparison result indicating that the voltage of the first communication line (the "SCL voltage" in the drawing) exceeds the reference voltage (e.g. 1.4 V) (i.e., Yes in S330), the selector 208 in the first input circuit 200 and the selector 218 in the second input circuit 210 respectively select signal values output by the input detector 206a and the input detector 216a (also referred to as "first input detectors") as output of the first input circuit 200 and output of the second input circuit 210. When there is obtained the comparison result indicating that the voltage of the first communication line is the reference voltage or less (i.e., No in S330), the selector 208 in the first input circuit 200 and the selector 218 in the second input circuit 210 respectively select the signal values output by the input detector 206b and the input detector 216b (second input detectors) as output of the first input circuit 200 and output of the second input circuit 210. This enables the first input circuit 200 and the second input circuit 210 to adjust the judgement thresholds.

In S360, the first input circuit 200 and the second input circuit 210 detect that a signal value of the second communication line is at logic L, and a logic H signal value of the first communication line has changed into a logic L signal value, by using the judgement thresholds after the adjustment (Yes in S360). From this, another circuit in the apparatus 2 which receives the signals SCLIN and SDAIN determines that the period for the start condition has ended. In S370, the first input circuit 200 and the second input circuit 210 respectively detect a signal value of the first communication line and a signal value of the second communication line by using the judgement thresholds after the adjustment, and the another circuit in the apparatus 2 receives data by using the signal SCLIN from the first input circuit 200 and the SDAIN from the second input circuit 210.

Figure 4:
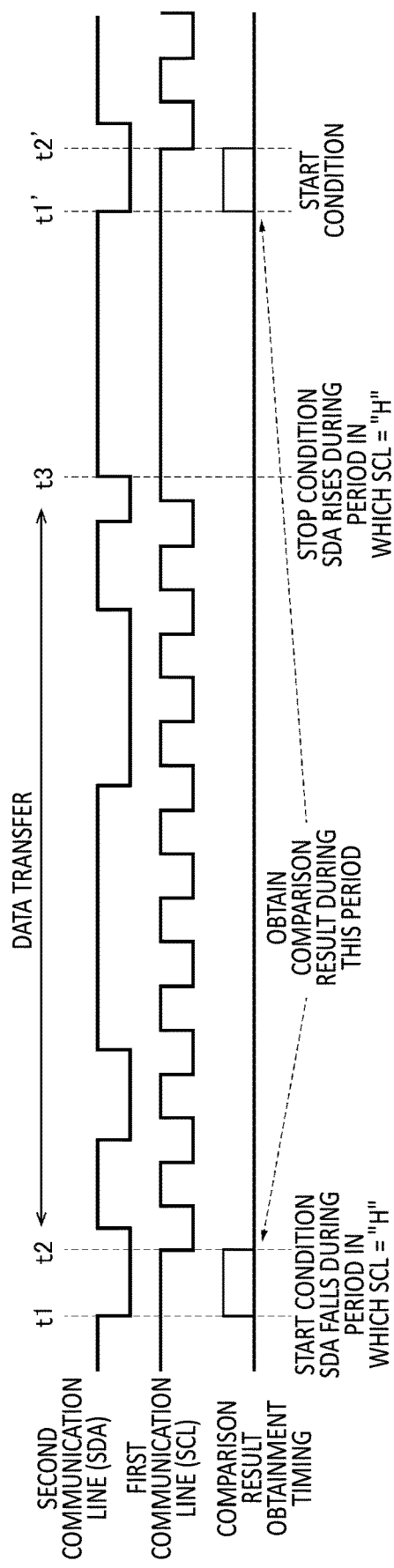
FIG. 4 illustrates operational timings of the apparatus 2 according to the present embodiment.

FIG. 4 illustrates operational timings of the apparatus 2 according to the present embodiment. Before time t1, a voltage of the first communication line exceeds the first voltage (logic H), and a voltage of the second communication line exceeds the second voltage (logic H), which corresponds to a state at S300 in FIG. 3. At time t1, once the start condition period starts in response to the signal from the second communication line being changed from logic H to logic L (which corresponds to Yes in S310), the obtainment circuit 240 obtains the comparison result obtained by the comparison circuit 230 (S320). The first input circuit 200 and the second input circuit 210 adjust the judgement thresholds according to the obtained comparison result (S330, S340, and S350).

At time t2, once the logic H signal from the first communication line changes into a logic L signal, the start condition period ends (Yes in S360). At time t2 onwards, data transfer using the first communication line and the second communication line is performed, in which the first input circuit 200 and the second input circuit 210 respectively receive a signal of the first communication line and a signal of the second communication line by using the adjusted judgement thresholds and output these signals as signals SCLIN and SDAIN to the another circuit in the apparatus 2. At time t3, once the logic L signal from the second communication line rises to a logic H signal during the period in which the signal from the first communication line is at logic H, a stop condition is met and thus the data transfer ends.

Subsequently, at time t1', once a next start condition period starts in response to a logic H signal from the second communication line changing into a logic L signal, the obtainment circuit 240 obtains the comparison result obtained by the comparison circuit 230. Then, the first input circuit 200 and the second input circuit 210 adjust the judgement thresholds according to the newly obtained comparison result.

The obtainment circuit 240 according to the present embodiment obtains the comparison result obtained by the comparison circuit 230 according to a timing of change in the signal from the second communication line during the period in which a voltage of the signal from the first communication line exceeds the first voltage. This is not limited to the storage circuit 248 obtaining the comparison result obtained by the comparison circuit 230 simultaneously or approximately simultaneously with the timing of change in the signal from the second communication line. For example, the storage circuit 248 may obtain the comparison result at time t2 after a predetermined delay time or before time t2 according to the timing of change.

In addition, the obtainment circuit 240 according to the present embodiment may obtain the comparison result within a period in which a voltage of a signal from the first communication line exceeds the first voltage and a voltage of a signal from the second communication line is the second voltage or less. For example, the obtainment circuit 240 may obtain the comparison result at any timing from time t1 to time t2 in the drawing. For example, the timing detection circuit 244 may output as the comparison result obtainment timing, a timing at which "(an output logical value of the input detector 204) AND NOT (an output logical value of the input detector 214)" rises. The timing detection circuit 244 may delay this timing of rise by a predetermined time and output the timing of rise as the comparison result obtainment timing.

The obtainment circuit 240 can also obtain a comparison result corresponding to a voltage taken before the first communication line showing logic H falls to logic L or a voltage of the first communication line that is taken immediately before. For example, the timing detection circuit 244 may output as the comparison result obtainment timing, a timing at which "(an output logical value of the input detector 204) AND NOT (an output logical value of the input detector 214)" falls. The storage circuit 248 may obtain a value obtained by delaying the comparison result from the comparison circuit 230 by a predetermined delay time at the obtainment timing.

Note that, the obtainment circuit 240 may determine an obtainment timing for obtaining the comparison result within a period in which the voltage of the signal from the first communication line exceeds the first voltage, according to a specification of the communication interface. For example, the obtainment circuit 240 may obtain the comparison result obtained by the comparison circuit 230 in response to a timing of change of the second communication line rising from logic L to logic H, depending on the specification of the communication interface.

Figure 5:
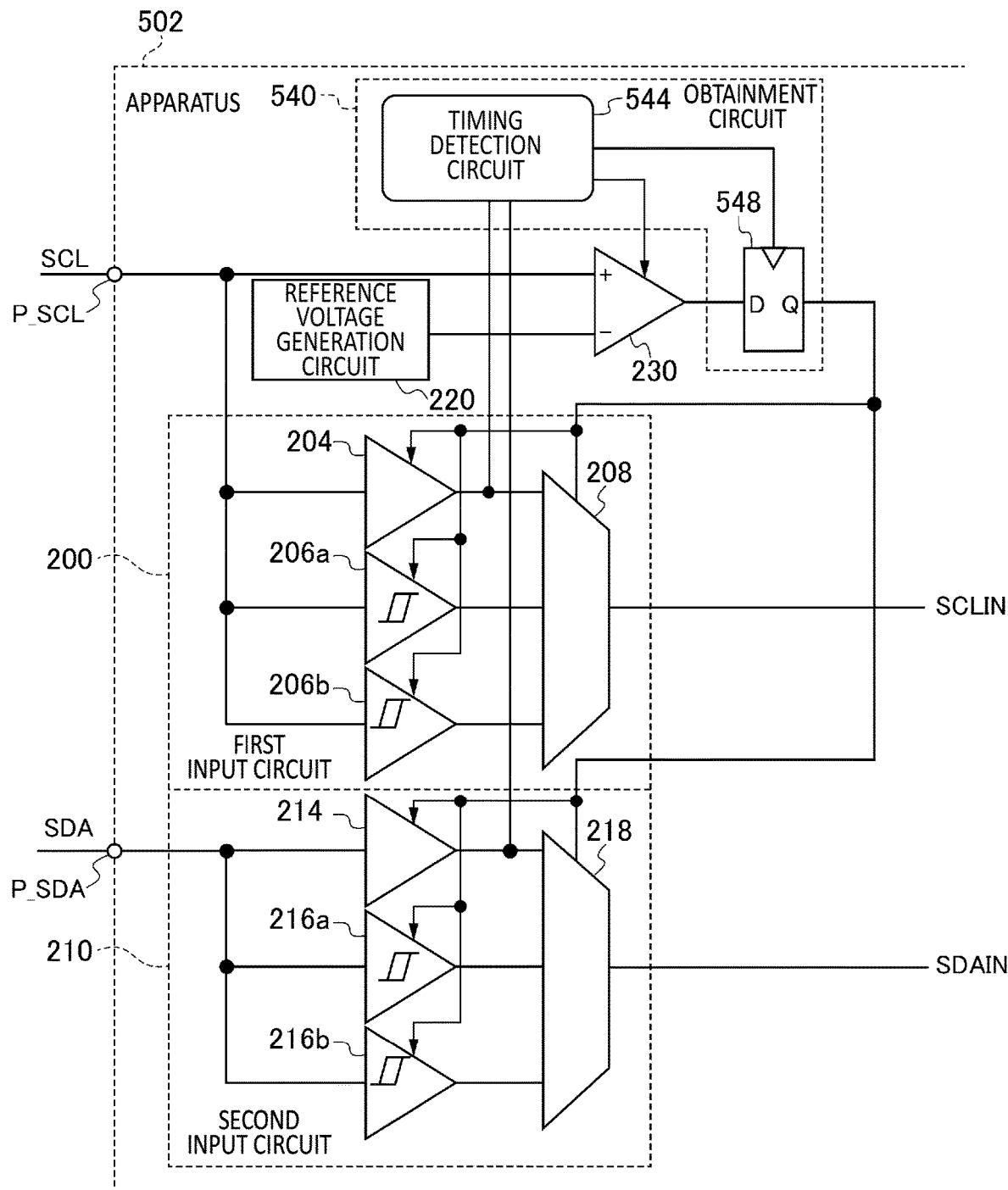
FIG. 5 illustrates structure of an apparatus 502 according to a variant example.

FIG. 5 illustrates structure of an apparatus 502 according to a variant example of the apparatus 2 in FIG. 2. In the present drawing, components having functions and structure the same as those of the apparatus 2 in FIG. 2 are denoted with the same reference numbers as those for the apparatus 2, and explanation therefor will be omitted except for the following differences.

The apparatus 502 includes an obtainment circuit 540 instead of the obtainment circuit 240. In addition to the functions of the obtainment circuit 240, the obtainment circuit 540 instructs to stop a comparison operation performed by a comparison circuit 230, to stop signal detection operations performed by an input detector 204 and an input detector 214, and to stop signal detection operations performed by input detectors 206a to 206b and input detectors 216a to 216b. The obtainment circuit 540 may have any one of, or two or more of these functions. The obtainment circuit 540 has a timing detection circuit 544 and a storage circuit 548.

The timing detection circuit 544 is connected to an input detector 204 in a first input circuit 200, and an input detector 214 in a second input circuit 210. The timing detection circuit 544 instructs the comparison circuit 230 to perform the comparison operation in a comparison period within a period in which a voltage of a signal from a first communication line exceeds a first voltage. The timing detection circuit 544 instructs the comparison circuit 230 to stop the comparison operation in a period other than the comparison period. The comparison circuit 230 executes/stops the comparison operation in response to the instruction from the timing detection circuit 544.

The timing detection circuit 544 may instruct the comparison circuit 230 to perform the comparison operation in a comparison period being an entire period in which the voltage of the signal from the first communication line exceeds the first voltage, or a part of the entire period. Instead of this, the timing detection circuit 544 may instruct the comparison circuit 230 to perform the comparison operation in a comparison period being an entire period in which the voltage of the signal from the first communication line exceeds the first voltage and a voltage of a signal from a second communication line is a second voltage or less, or a part of the entire period. The timing detection circuit 544 may end the comparison period after the storage circuit 548 has finished obtaining the comparison result.

While the comparison operation is stopped, the comparison circuit 230 may transition to a low-power consumption mode in which less power is consumed compared to a normal mode for executing the comparison operation. Instead of this, the comparison circuit 230 may be powered off while the comparison operation is stopped.

Similar to the timing detection circuit 244, the timing detection circuit 544 determines a timing to obtain the comparison result output by the comparison circuit 230 by using a signal value of the first communication line detected by the input detector 204 and a signal value of the second communication line detected by the input detector 214. The timing detection circuit 544 may determine as the obtainment timing, a timing at which a value of the comparison result is stable after a predetermined margin time has been passed since a start of the comparison period.

The storage circuit 548 is connected to the comparison circuit 230 and the timing detection circuit 544. Similar to the storage circuit 248, the storage circuit 548 obtains the comparison result output by the comparison circuit 230 at the obtainment timing determined by the timing detection circuit 244, and stores the comparison result.

The multiple input detectors 206 and the multiple input detectors 216 may switch whether to perform signal detection operation, depending on the comparison result obtained from the storage circuit 548. At least one input detector 206 having output that is not selected by the selector 208 between the multiple input detectors 206, and at least one input detector 216 having output that is not selected by the selector 218 between the multiple input detectors 216 may stop performing signal value detection operation. While the signal value detection operation is stopped, each of the input detectors 206 and each of the input detectors 216 may transition to low-power consumption modes in which less power is consumed compared to normal modes for executing the signal value detection operation. Instead of this, the each of the input detectors 206 and the each of the input detectors 216 may be powered off while the signal value detection operation is stopped.

The input detector 204 and the input detector 214 may switch whether to perform the signal value detection operation, depending on the comparison result obtained from the storage circuit 548. When the input detector 204 and the input detector 214 are respectively selected by the selector 208 and the selector 218, they may execute the signal value detection operation, but when the input detector 204 and the input detector 214 are not respectively selected by the selector 208 and the selector 218, they may stop performing the signal value detection operation. The input detector 204 and the input detector 214 may start the signal value detection operation in response to receiving a signal indicating a stop condition from a communication interface according to an instruction of the obtainment circuit 540, and may stop performing the signal value detection operation after the timing for the storage circuit 548 to obtain the comparison result, or after a start condition obtained from the communication interface has ended.

While the signal value detection operation is stopped, the input detector 204 and the input detector 214 may transition to low-power consumption modes in which less power is consumed compared to normal modes for executing the signal value detection operation. Instead of this, the input detector 204 and the input detector 214 may be powered off while the signal value detection operation is stopped.

Figure 6:
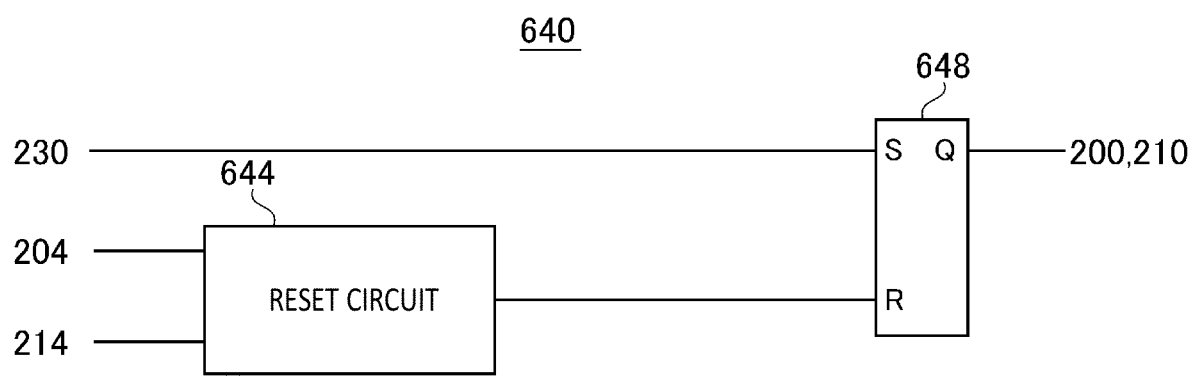
FIG. 6 illustrates structure of an obtainment circuit 640 according to the variant example.

FIG. 6 illustrates structure of an obtainment circuit 640 according to the variant example. Because the obtainment circuit 640 is a variant example of the obtainment circuit 240 in FIG. 2, explanation thereof will be omitted except for the following differences.

The obtainment circuit 640 has a storage circuit 648 and a reset circuit 644. The storage circuit 648 is used instead of the storage circuit 248 in FIG. 2. By way of example, the storage circuit 648 is a set-reset flip-flop, which is set by a rise in a set input S so that an output Q is leveled at logic H, and is reset by a rise in a reset input R so that the output Q is leveled at logic L.

The reset circuit 644 is used instead of the timing detection circuit 244 in FIG. 2. The reset circuit 644 inputs a signal that rises according to a timing of change in a signal from the second communication line during a period in which a voltage of a signal from the first communication line exceed a first voltage, to a reset input R of the storage circuit 648. In this way, the storage circuit 648 resets the comparison result that has been obtained (previous comparison result) and set output at logic L. For example, the reset circuit 644 may be composed of a circuit which outputs a pulse with a predetermined time width according to a timing at which "(an output logical value of the input detector 204) AND NOT (an output logical value of the input detector 214)" rises.

Here, the storage circuit 648 obtains a new comparison result indicating that a voltage of the first communication line has exceeded the reference voltage (comparison result indicating logic H), in response to the output of the comparison circuit 230 (i.e., set input S for the storage circuit 648) rising after being reset. The storage circuit 648 does not obtain the new comparison result if the output of the comparison circuit 230 remains at logic L without rising after being reset, but as a result of that, the storage circuit 648 rather outputs a comparison result indicating that the voltage of the first communication line is the reference voltage or less (comparison result indicating logic L).

According to the apparatus 2 and the apparatus 502 shown above, the judgement threshold of the input circuit can be adjusted according to a voltage specification being in use between the two types of the voltage specifications of the communication interface. In order to support three or more types of voltage specifications, the reference voltage generation circuit 220 may generate multiple threshold voltages corresponding to ranges of voltage specifications of multiple types. One or more comparison circuits 230 may use the multiple threshold voltages from the reference voltage generation circuit 220 to an output comparison result indicating that the voltage of the first communication line belongs to which one of multiple voltage ranges corresponding to the voltage specifications of the multiple types. The first input circuit 200 and the second input circuit 210 may respectively have the input detectors 206 and the input detectors 216 each of which corresponds to each of the voltage specifications of the multiple types. The selector 208 and the selector 218 may respectively select the input detector 206 and the input detector 216 to be used for judging a signal value depending on the comparison result obtained by the comparison circuit 230.

The apparatus 2 or the apparatus 502 shown above uses a serial interface as the communication interface. Instead of this, the apparatus 2 or the apparatus 502 may use a parallel interface as the communication interface. In this case, the communication interface may have one or two or more first communication lines, and two or more second communication lines. Due to specification of the communication interface, the apparatus 2 or the apparatus 502 may identify a period in which a voltage of the signal from the first communication line exceeds the first voltage based on signal values of the first communication line and the second communication line, and select the input detector 206 and the input detector 216 to be used for judging the signal value depending on the comparison result obtained by the comparison circuit 230 at this timing.

While the present invention has been described by way of the embodiments, the technical scope of the present invention is not limited to the above described embodiments. It is apparent to persons skilled in the art that various alterations or improvements can be made to the above described embodiments. It is also apparent from description of the claims that embodiments to which such alterations or improvements are made can be included in the technical scope of the present invention.

It should be noted that the operations, procedures, steps, stages, and the like of each processing performed by an apparatus, system, program, and method shown in the claims, specification, or drawings can be executed in any order as long as the order is not indicated by "before", "prior to" or the like and as long as the output from previous processing is not used in later processing. Even if the operational flow is described using phrases such as "first" or "next" for the sake of convenience in the claims, specification, or drawings, it does not necessarily mean that the processing must be performed in this order.

EXPLANATION OF REFERENCES

2: apparatus;
200: first input circuit;
204: input detector;
206a to 206b: input detectors;
208: selector;
210: second input circuit;
214: input detector;
216a to 216b: input detectors;
218: selector;
220: reference voltage generation circuit;
230: comparison circuit;
240: obtainment circuit;
244: timing detection circuit;
248: storage circuit;
502: apparatus;
540: obtainment circuit;
544: timing detection circuit;
548: storage circuit;
640: obtainment circuit;
644: reset circuit;
648: storage circuit.

What is claimed is:

1. An apparatus comprising:
a first input circuit which inputs a signal from a first communication line in serial communication;
a second input circuit which inputs a signal from a second communication line in the serial communication;
a reference voltage generation circuit which generates a reference voltage;
a comparison circuit which compares the reference voltage with a voltage of the first communication line; and
an obtainment circuit which obtains a comparison result obtained by the comparison circuit according to a timing of change in the signal from the second communication line during a period in which a voltage of the signal from the first communication line exceeds a first voltage, wherein
the first input circuit and the second input circuit adjust judgement thresholds to be used for judging signal values according to the comparison result obtained by the obtainment circuit.

2. The apparatus according to claim 1, wherein the obtainment circuit obtains the comparison result within a period in which the voltage of the signal from the first communication line exceeds the first voltage.

3. The apparatus according to claim 2, wherein the obtainment circuit obtains the comparison result within a period in which the voltage of the signal from the first communication line exceeds the first voltage, and a voltage of the signal from the second communication line is a second voltage or less.

4. The apparatus according to claim 3, wherein the obtainment circuit resets the comparison result that has been obtained, according to the timing of change in the signal from the second communication line during the period in which the voltage of the signal from the first communication line exceeds the first voltage, and obtains a new comparison result indicating that the voltage of the first communication line has exceeded the reference voltage in response to output of the comparison circuit rising after the resetting.

5. The apparatus according to claim 3, wherein
input circuits that are the first input circuit and the second input circuit, each has:
multiple input detectors which detect, by using the judgement thresholds different from each other, signal values corresponding to a voltage of a corresponding communication line that is the first communication line or the second communication line; and
a selector which selects a signal value output by one of the multiple input detectors as output of a corresponding input circuit that is the first input circuit or the second input circuit, depending on the comparison result obtained by the comparison circuit.

6. The apparatus according to claim 2, wherein
input circuits that are the first input circuit and the second input circuit, each has:
multiple input detectors which detect, by using the judgement thresholds different from each other, signal values corresponding to a voltage of a corresponding communication line that is the first communication line or the second communication line; and
a selector which selects a signal value output by one of the multiple input detectors as output of a corresponding input circuit that is the first input circuit or the second input circuit, depending on the comparison result obtained by the comparison circuit.

7. The apparatus according to claim 1, wherein
input circuits that are the first input circuit and the second input circuit, each has:
multiple input detectors which detect, by using the judgement thresholds different from each other, signal values corresponding to a voltage of a corresponding communication line that is the first communication line or the second communication line; and
a selector which selects a signal value output by one of the multiple input detectors as output of a corresponding input circuit that is the first input circuit or the second input circuit, depending on the comparison result obtained by the comparison circuit.

8. The apparatus according to claim 7, wherein at least one input detector, among the multiple input detectors, of which output was not selected by the selector stops performing signal value detection operation.

9. The apparatus according to claim 1, wherein the comparison circuit performs comparison operation in a comparison period within the period in which the voltage of the signal from the first communication line exceeds the first voltage, and stops performing the comparison operation in a period other than the comparison period.

10. The apparatus according to claim 9, wherein the comparison circuit performs the comparison operation within the comparison period in which the voltage of the signal from the first communication line exceeds the first voltage, and a voltage of the signal from the second communication line is a second voltage or less.

11. A method comprising:
inputting, by a first input circuit, a signal from a first communication line in serial communication;
inputting, by a second input circuit, a signal from a second communication line in the serial communication;
generating, by a reference voltage generation circuit, a reference voltage;
comparing, by a comparison circuit, the reference voltage with a voltage of the first communication line;
obtaining, by an obtainment circuit, a comparison result obtained by the comparison circuit according to a timing of change in the signal from the second communication line during a period in which a voltage of the signal from the first communication line exceeds a first voltage; and
adjusting, by the first input circuit and the second input circuit, judgement thresholds to be used for judging signal values according to the comparison result obtained by the obtainment circuit.

12. The method according to claim 11, wherein the obtainment circuit obtains the comparison result within the period in which the voltage of the signal from the first communication line exceeds the first voltage.

13. The method according to claim 12, wherein the obtainment circuit obtains the comparison result within a period in which the voltage of the signal from the first communication line exceeds the first voltage, and a voltage of the signal from the second communication line is a second voltage or less.

14. The method according to claim 13, wherein the obtainment circuit resets the comparison result that has been obtained, according to the timing of change in the signal from the second communication line during the period in which the voltage of the signal from the first communication line exceeds the first voltage, and obtains a new comparison result indicating that the voltage of the first communication line has exceeded the reference voltage in response to output of the comparison circuit rising after the resetting.

15. The method according to claim 13 wherein:
input circuits that are the first input circuit and the second input circuit, each has:
multiple input detectors which detect, by using the judgement thresholds different from each other, signal values corresponding to a voltage of a corresponding communication line that is the first communication line or the second communication line; and
a selector which selects a signal value output by one of the multiple input detectors as output of a corresponding input circuit that is the first input circuit or the second input circuit, depending on the comparison result obtained by the comparison circuit.

16. The method according to claim 12, wherein:
input circuits that are the first input circuit and the second input circuit, each has:
multiple input detectors which detect, by using the judgement thresholds different from each other, signal values corresponding to a voltage of a corresponding communication line that is the first communication line or the second communication line; and
a selector which selects a signal value output by one of the multiple input detectors as output of a corresponding input circuit that is the first input circuit or the second input circuit, depending on the comparison result obtained by the comparison circuit.

17. The method according to claim 11, wherein:
input circuits that are the first input circuit and the second input circuit, each has:
multiple input detectors which detect, by using the judgement thresholds different from each other, signal values corresponding to a voltage of a corresponding communication line that is the first communication line or the second communication line; and
a selector which selects a signal value output by one of the multiple input detectors as output of a corresponding input circuit that is the first input circuit or the second input circuit, depending on the comparison result obtained by the comparison circuit.

18. The method according to claim 17, wherein at least one input detector, among the multiple input detectors, of which output was not selected by the selector stops performing signal value detection operation.

19. The method according to claim 11, wherein the comparison circuit performs comparison operation in a comparison period within the period in which the voltage of the signal from the first communication line exceeds the first voltage, and stops performing the comparison operation in a period other than the comparison period.

20. The method according to claim 19, wherein the comparison circuit performs the comparison operation within the comparison period in which the voltage of the signal from the first communication line exceeds the first voltage, and a voltage of the signal from the second communication line is a second voltage or less.

* * * * *